(12) United States Patent
Hadidi et al.

(10) Patent No.: US 8,592,783 B2
(45) Date of Patent: Nov. 26, 2013

(54) TITANIUM DIBORIDE COATING FOR PLASMA PROCESSING APPARATUS

(75) Inventors: Kamal Hadidi, Somerville, MA (US); George D. Papasouliotis, North Andover, MA (US); Craig R. Chaney, Lanesville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 5 days.

(21) Appl. No.: 13/245,035

(22) Filed: Sep. 26, 2011

(65) Prior Publication Data

US 2013/0075253 A1 Mar. 28, 2013

(51) Int. Cl.
*G21K 5/00* (2006.01)
(52) U.S. Cl.
USPC .................................... 250/492.1; 250/492.3
(58) Field of Classification Search
USPC ................ 250/492.1, 492.2, 492.22, 492.21, 250/492.3
See application file for complete search history.

(56) References Cited

U.S. PATENT DOCUMENTS

| | | | |
|---|---|---|---|
| 6,120,640 A | 9/2000 | Shih et al. | |
| 2004/0092120 A1* | 5/2004 | Wicker | 438/710 |
| 2007/0207267 A1* | 9/2007 | Laube | 427/230 |
| 2008/0169427 A1* | 7/2008 | Hatem et al. | 250/429 |

* cited by examiner

*Primary Examiner* — Nicole Ippolito

(57) ABSTRACT

An improved plasma processing chamber is disclosed, wherein some or all of the components which are exposed to the plasma are made of, or coated with, titanium diborane. Titanium diborane has a hardness in excess of 9 mhos, making it less susceptible to sputtering. In addition, titanium diborane is resistant to fluoride and chlorine ions. Finally, titanium diborane is electrically conductive, and therefore the plasma remains more uniform over time, as charge does not build on the surfaces of the titanium diborane components. This results in improved workpiece processing, with less contaminants and greater uniformity. In other embodiments, titanium diborane may be used to line components within a beam line implanter.

10 Claims, 3 Drawing Sheets

TITANIUM DIBORIDE COATING FOR PLASMA PROCESSING APPARATUS

BACKGROUND

A plasma processing apparatus generates a plasma in a chamber which can be used to treat a workpiece supported by a platen in a process chamber. In some embodiments, the chamber in which the plasma is generated is the process chamber. Such plasma processing apparatus may include, but not be limited to, doping systems, etching systems, and deposition systems. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

In other embodiments, the plasma may be generated in one chamber, which ions are extracted from, and the workpiece is treated in a different process chamber. One example of such a configuration may be a beam line ion implanter where the ion source utilizes an inductively coupled plasma (ICP) source. The plasma is generally a quasi-neutral collection of ions (usually having a positive charge) and electrons (having a negative charge). The plasma has an electric field of about 0 volts per centimeter in the bulk of the plasma.

Turning to FIG. 1, a block diagram of one exemplary plasma processing apparatus 100 is illustrated. The plasma processing apparatus 100 includes a process chamber 102 defining an enclosed volume 103. A gas source 104 provides a primary dopant gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma processing apparatus 100 may further include a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma processing apparatus 100 further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma processing apparatus 100 may also include a bias power supply 190 electrically coupled to the platen 134. The plasma processing system 100 may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma processing apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary dopant gas containing a desired dopant for implantation into the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a pulsed platen signal having a pulse ON and OFF periods to bias the platen 134 and hence the workpiece 138 to accelerate ions 109 from the plasma 140 towards the workpiece 138. The ions 109 may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy.

One of the main problems in plasma processing equipment used for semiconductor substrates is metal contamination due to the chemical corrosion and physical erosion of the material within the plasma processing chamber 103. This may be due to chemical attack and sputtering of the material by reactive species and energetic ions. In some processes, chamber liners, made of materials such as quartz or silicon-spayed aluminum, have been used to protect the walls 107 of the process chamber 103. The drawback of these materials is that quartz is a non conductive material and silicon is a semiconductor with poor electric conductivity. Using non conductive or poorly conductive liners and coatings leads to a drift in the plasma potential, which in turn leads to plasma instabilities. This phenomenon leads to nonuniformity in the processing of the semiconductor substrates.

Therefore, it would be advantageous if the material in the chamber could be resistant to sputtering and corrosion, while remaining electrically conductive.

SUMMARY

An improved plasma processing chamber is disclosed, wherein some or all of the components which are exposed to the plasma are made of, or coated with, titanium diborane. Titanium diborane has a hardness in excess of 9 mhos, making it less susceptible to sputtering. In addition, titanium diborane is resistant to fluoride and chlorine ions. Finally, titanium diborane is electrically conductive, and therefore the plasma remains more uniform over time, as charge does not build on the surfaces of the titanium diborane components. This results in improved workpiece processing, with less contaminants and greater uniformity. In other embodiments, titanium diborane may be used to line components within a beam line implanter.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
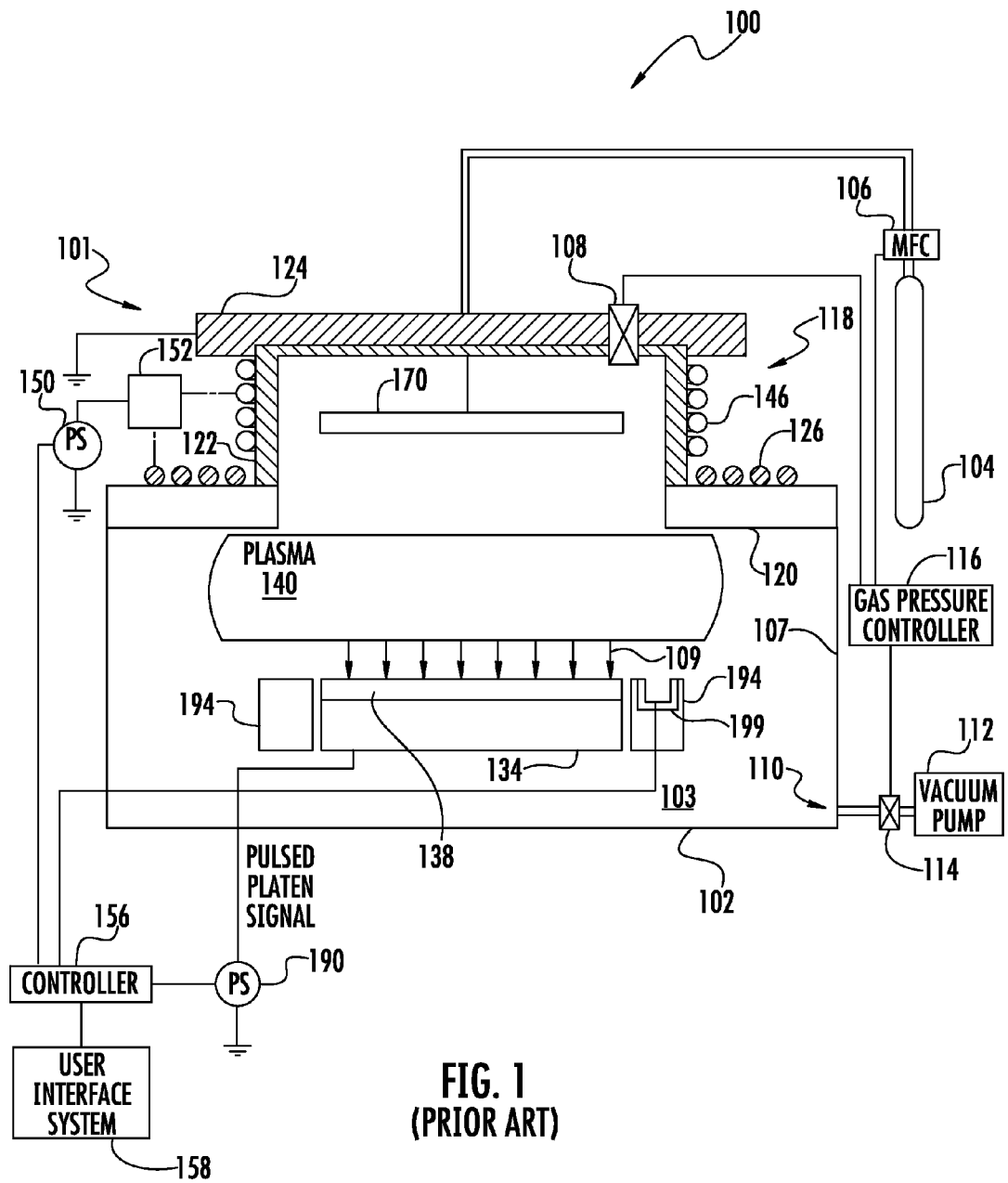
FIG. 1 is a block diagram of a plasma processing apparatus of the prior art.

As the size of electronic features continues to shrink, the requirements on the particle and metal tolerance inside the processing chamber 103 become more stringent. In plasma processing tools, it is well known that the ions in the plasma can react with the walls 107 of the chamber 103, as well as the materials of various components in the chamber, such as the gas baffle 170 and the shield ring 194 around the wafer. These reactions may be physical reactions, such as sputtering due to energetic ions, and/or chemical reactions, such as etching due to reactive species such as free radicals. Generally, plasmas are purposely used because of their reactive and energetic species nature. It is therefore difficult to isolate the desired effect of the plasma on the substrate from the effect of the plasma on the chamber walls and other components of the chamber 103. One way to achieve this goal is to cover the chamber walls and all other components with a material that is not sensitive to ion sputtering and chemical etching from the plasma species.

Previously, most chamber walls are coated with materials, such as quartz, silicon carbide, silicon, or just anodized aluminum. In some cases, these chambers use liners that are coated with materials such as silicon. In general, these materials are selected based on one of two criteria. In some cases, the coating or liner is compatible with the substrate, such as the use of silicon as a liner. In other cases, the material for the coating or liner is selected based on its hardness and resistance to chemical attack from the plasma species (radicals and ions). In general, all these materials have very poor electric conductivity. This leads to a drift in the plasma potential as chamber components are covered with layers of increasing thickness, which in turn can lead to a drift in the semiconductor manufacturing process with consequences on process uniformity and device yield. It is therefore important to use a coating material that is as hard as possible to resist physical sputtering, as chemically inert as possible to resist chemical etching, and as electrically conductive as possible to avoid plasma potential drift and charge build up.

Table 1 shows several materials commonly used for coatings or liners.

TABLE 1

| Compound | Electric resistivity (ohm-cm) | Hardness (mhos) | Susceptibility |
|---|---|---|---|
| Aluminum | $2.65 \times 10^{-8}$ | 2.75 | Attacked by Cl |
| Silicon | $10^{-4}$-$10^{4}$ | 7 | |
| $B_4C$ | 0.1-10 | 9.3 | |
| Graphite | $5 \times 10^{-6}$-$30 \times 10^{-5}$ | 1-2 | |
| Silicon carbide | $10^{6}$ | 9.1-9.5 | Resists HF |

Note that while aluminum and graphite are both conductive, each is relatively soft, which makes each susceptible to sputtering. In addition, aluminum is susceptible to attack by chlorine, which causes it to chemically react.

Those compounds with sufficient hardness, such as $B_4C$ and silicon carbide, have relatively high resistivities, making them poor conductors of electricity. This allows the plasma to drift.

Thus, an element having sufficient hardness, such as greater than 9 mhos, and low resistivity, such as less than $10^{-4}$ ohm-cm, would be beneficial.

Titanium diborane, also known as titanium boride or titanium diboride, ($TiB_2$) has an electrical resistivity of about $10^{-5}$ ohm-cm, and has a hardness in excess of 9.5 mhos. Additionally, titanium diborane is resistant to chemical reaction in the presence of fluorine and chlorine. These properties make it an ideal material for use in liners, coatings and components within the chamber 103.

Within the chamber 103, there are several portions that may be coated with titanium diborane to increase their resistance to sputtering and chemical attack. The thickness may vary based on the part being coated and the location of that part relative to the plasma. In some embodiments, the coating may be between 0.01 to 0.10 inches or greater. For example, the walls 107 of the chamber 103 may be coated. The term "walls" as used herein is intended to encompass all of the interior surfaces of the chamber 103, including vertical walls 107, as well as horizontal surfaces, such as the inner bottom surface, and upper surface. The term also includes any slanted surfaces that may comprise the chamber 103. Typically, these walls may be manufactured using a substrate, which may be a metal, such as aluminum.

In one embodiment, the titanium diborane coating may be electroplated onto the walls 107 of the chamber 103. In other embodiments, the titanium diborane may be deposited by thermal spraying, or physical vapor deposition (PVD).

Figure 2:
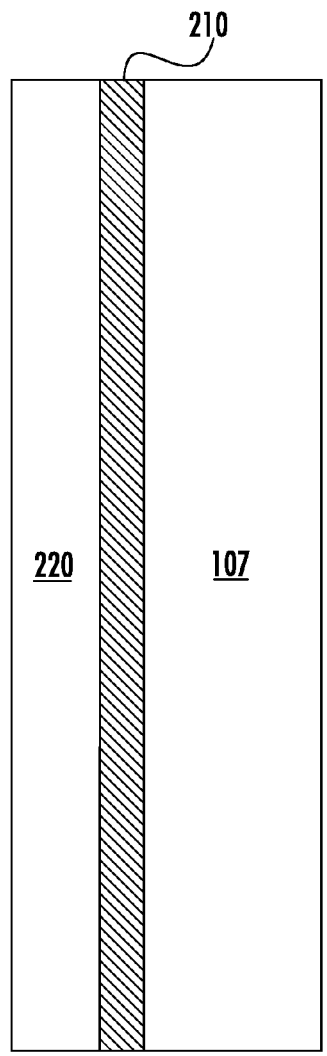
FIG. 2 shows a cross-section of a component within a plasma processing chamber having a titanium diborane coating and an intermediate layer to improve adhesion.

In some embodiments, it may be advantageous to provide an intermediate layer between the wall 107 and the titanium diborane coating, such as to improve adhesion or reduce thermal stress. FIG. 2 shows a wall 107 having an intermediate layer 210 and a titanium diborane coating 220. This intermediate layer 210 may be any suitable material, such as but not limited to titanium oxide, $TiN/TiB_2$ nanolayered structures, or ternary compounds of titanium, carbon and nitrogen. These intermediate layers 210 may be applied by PVD, CVD or other plasma spray techniques. The thickness of this intermediate layer 210 may vary based on the type of part, as well as the difference in coefficients of thermal expansion between the wall 107 and the coating 220. After the application of the intermediate layer 210, the titanium diborane coating 220 can be applied, using any of the techniques described above. This process can be used to coat the inner surfaces of the chamber 103. In addition, it can be used to coat components located within the chamber 103, if desired. Such components include but are not limited to the gas baffle 170, the shield ring 194, and any other component located within the plasma chamber 103.

Figure 3:
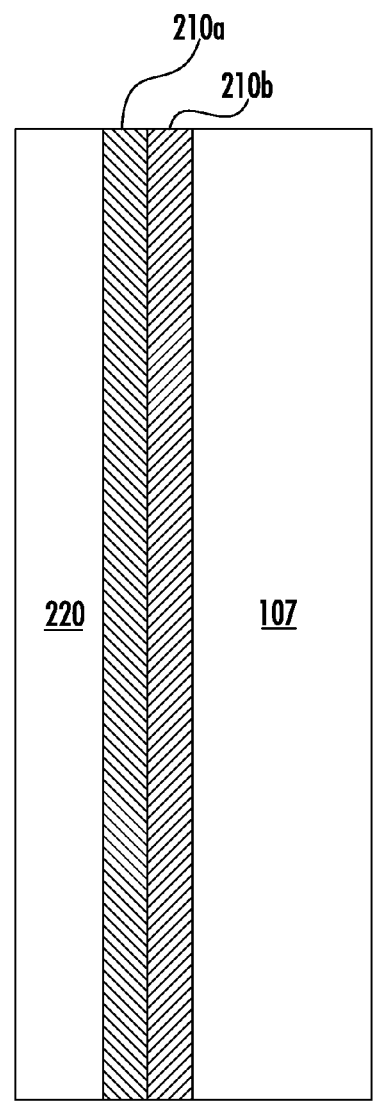
FIG. 3 shows a cross-section of a component within a plasma processing chamber having a titanium diborane coating and a plurality of intermediate layers to provide a CTE gradient.

The use of one or more intermediate layers 210 may also reduce thermal stress, if the difference in the coefficients of thermal expansion (CTE) between the titanium diborane and the substrate to which it is being applied is too great. For example, one or more intermediate layers 210, each having a CTE value between those of its adjacent layers may be used to provide a gradient. For example, assume that a single intermediate layer 210 is to be used when coating an aluminum wall. The CTE of that intermediate layer would be selected to be between that of titanium diborane and aluminum. If two intermediate layers are employed, as shown in FIG. 3, the intermediate layer 210a nearer the titanium diborane 220 would have a CTE between that of titanium diborane 220 and the second intermediate layer 210b. The second intermediate layer 210b would have a CTE between that of the first intermediate layer 210a and the aluminum wall 107. Of course, any number of intermediate layers may be used. These intermediate layers are applied using any of the techniques described above. In some embodiments, these intermediate layers may be any of the type enumerated above, or materials comprising $TiB_2$/SiN nanolayers.

In another embodiment, certain components within the chamber 103 may be lined with liners made of titanium diborane. For example, the walls of the plasma chamber 103 may be lined with liners made of this material. These liners may be solid and constructed entirely of titanium diborane.

In another embodiment, certain components within the chamber 103 may be made of titanium diborane. For example, the shield ring 194 is subjected to high energy ion bombardment. Thus, this shield ring 194 preferably has very high hardness to avoid sputtering. In addition, it should resist chemical reactions with the components within the plasma. Additionally, high electrical conductivity is preferable to avoid the creation of surface charge due to secondary electrons. To manufacture this shield ring 194, the titanium diborane may be cast in a mold and hot pressed. The resulting component may then be ground to the exact dimensions required.

In addition to the shield ring 194, other components within the chamber 103 may also be constructed of titanium diborane. For example, it may be beneficial to manufacture the gas baffle 170 from TiB2, due to its interaction with the corrosive gasses in the chamber. Furthermore, any of the components which can be coated, such as the walls 107 of the chamber 103, may be constructed entirely of titanium diborane, if desired.

In summary, surfaces within the chamber 103 may be coated with titanium diborane, either directly or after application of one or more intermediate layers. These surfaces may be any surface which is exposed to the plasma within the chamber 103, including but not limited to chamber walls 107, shield ring 194, gas baffle 170. Alternatively, or in addition, one or more components within the chamber 103, including those previously listed, may be constructed of titanium diborane.

The processing chamber 103 may then be used to process a substrate or workpiece. The use of titanium diborane of these surfaces reduces the sputtering that occurs to these surfaces, as well as the build up of insulating films on these surfaces. This causes fewer contaminants in the processed workpiece (due to reduced sputtering), as well as better uniformity (due to reduced films). Thus, a workpiece may be processed more effectively within a chamber 103 having one or more surface either coated with or made of titanium diborane.

Figure 4:
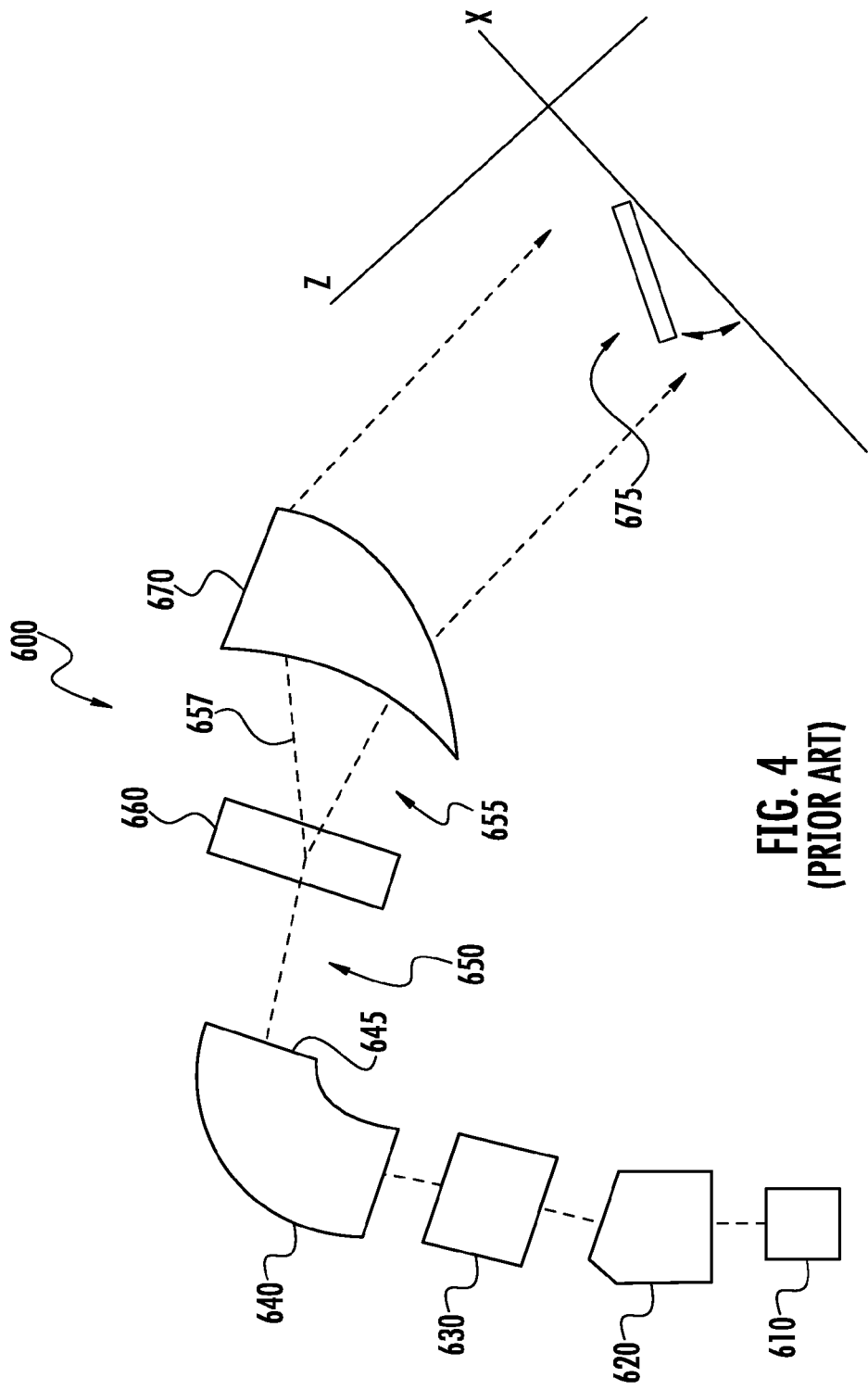
FIG. 4 is a block diagram of a beam line ion implanter of the prior art.

In addition to use within a plasma processing chamber, titanium diborane may be useful in ion beam implanters. A block diagram of a representative ion implanter 600 is shown in FIG. 4. Of course, one skilled in the art will recognize that numerous other ion implanter designs exist and may be used. An ion source 610 generates ions of a desired species, such as phosphorus or boron. The ion source 610 may have an indirectly heated cathode (IHC) or other means of creating ions. Furthermore, the ion source 610 may have walls enclosing a chamber into which gas, such as dopant-containing gasses, are introduced. The application or heat or voltage to this gas causes the creation of ions.

A set of electrodes (not shown) is typically used to attract the ions from the ion source 610. By using an electrical potential of opposite polarity to the ions of interest, the electrodes draw the ions from the ion source 610, and the ions accelerate through the electrode. These attracted ions are then formed into an ion beam 650, which then passes through a source filter 620. The source filter 620 is preferably located near the ion source 610. The ions within the ion beam 650 are accelerated/decelerated in column 630 to the desired energy level. A mass analyzer magnet 640, having an aperture 645, is used to remove unwanted components from the ion beam 650, resulting in an ion beam 650 having the desired energy and mass characteristics passing through resolving aperture 645.

In certain embodiments, the ion beam 650 is a spot beam. In this scenario, the ion beam 650 passes through a scanner 660, such as an electrostatic scanner, which deflects the ion beam 650 to produce a scanned beam 655 wherein the individual beamlets 657 have trajectories which diverge from scanner 660. In certain embodiments, the scanner 660 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to uniformly expose the scanned beam 655 at every position of the substrate for nearly the same amount of time. Deviations from the triangle are used to make the beam uniform.

An angle corrector 670 is adapted to deflect the divergent ion beamlets 657 into a set of ion beamlets 657 having substantially parallel trajectories. Preferably, the angle corrector 670 comprises a magnet coil and magnetic pole pieces that are spaced apart to form a gap, through which the ion beamlets 657 pass. The coil is energized so as to create a magnetic field within the gap, which deflects the ion beamlets 657 in accordance with the strength and direction of the applied magnetic field. The magnetic field is adjusted by varying the current through the magnet coil. Alternatively, other structures, such as parallelizing lenses, can also be utilized to perform this function.

Following the angle corrector 670, the scanned beam 655 is targeted toward the substrate to be processed. The substrate is attached to a substrate holder 675. The substrate holder 675 may provide a plurality of degrees of movement. For example, the substrate holder 675 can be moved in the direction orthogonal to the scanned beam 655.

In the beamline ion implanter, shown in FIG. 4, various components may be constructed from titanium diborane. For example, the ion source 610 is subject to extreme heat and various gasses, such as fluorine, which damage the walls of the ion source 610. To protect the ion source, reduce downtime and extend the life of the component, the walls of the ion source 610 may be protected by liners constructed from titanium diborane. These liners are placed within the ion source 610, such as to be between the gas and the walls of the source, thereby protecting the walls from exposure to the ions. In some embodiments, liners are disposed on only some of the walls defining the chamber. As described above, the liners may be made by casting the titanium diborane in a mold and hot pressing it. The liners are then ground to the dimensions required to fit within the ion source 610.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma processing chamber for processing a workpiece, comprising:
    one or more inner surfaces defining a volume where a plasma is formed; and
    a component within or forming part of said plasma processing chamber, said component comprising a coating comprising titanium diborane; and
    an intermediate layer between said coating and said component to improve adhesion of said titanium diborane to said component.

2. The plasma processing chamber of claim 1, wherein said component comprises said inner surface of said chamber.

3. The plasma processing chamber of claim 1, wherein said intermediate layer has a coefficient of thermal expansion between that of said titanium diborane and that of said component.

4. The plasma processing chamber of claim 1, wherein said component is selected from the group consisting of a gas baffle and a shield ring.

5. A plasma processing chamber for processing a workpiece comprising:
    one or more inner surfaces defining a volume where a plasma is formed; and
    a component within or forming part of said plasma processing chamber, said component comprising a coating comprising titanium diborane; and
    at least one intermediate layer between said coating and said component, said at least one intermediate layer having a coefficient of thermal expansion between that of said titanium diborane and that of said component.

6. The chamber of claim 5, wherein said component is selected from the group consisting of a gas baffle and a shield ring.

7. The chamber of claim 5, wherein said component comprises said inner surface of said chamber.

8. A ion source for use within a beam line ion implanter comprising:
    a plurality of walls defining a chamber;
    means for creating ions within said chamber;
    an electrode to draw said ions from said chamber; and
    a liner comprising titanium diborane disposed on at least one of said walls; and
    at least intermediate layer between said liner and said wall, said at least one intermediate layer having a coefficient of thermal expansion between that of said titanium diborane and that of said wall.

9. The ion source of claim 8, wherein said means for creating ions comprises an indirectly heated cathode.

10. The ion source of claim 8, wherein said intermediate layer between said liner and said wall improves adhesion of said titanium diborane to said wall.

* * * * *

UNITED STATES PATENT AND TRADEMARK OFFICE
CERTIFICATE OF CORRECTION

| | | |
|---|---|---|
| PATENT NO. | : 8,592,783 B2 | Page 1 of 1 |
| APPLICATION NO. | : 13/245035 | |
| DATED | : November 26, 2013 | |
| INVENTOR(S) | : Kamal Hadidi et al. | |

It is certified that error appears in the above-identified patent and that said Letters Patent is hereby corrected as shown below:

In the Claims

Column 8, Line 31, Claim 8, "at least intermediate layer..." should be changed to --at least one intermediate layer--

Signed and Sealed this
Twenty-second Day of April, 2014

Michelle K. Lee
*Deputy Director of the United States Patent and Trademark Office*